(12) United States Patent
Ho et al.

(10) Patent No.: US 11,594,425 B2
(45) Date of Patent: Feb. 28, 2023

(54) SEMICONDUCTOR PACKAGE STRUCTURE AND FABRICATING METHOD OF THE SAME

(71) Applicant: PANJIT INTERNATIONAL INC., Kaohsiung (TW)

(72) Inventors: Chung-Hsiung Ho, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 134 days.

(21) Appl. No.: 17/096,834

(22) Filed: Nov. 12, 2020

(65) Prior Publication Data

US 2021/0225662 A1 Jul. 22, 2021

(30) Foreign Application Priority Data

Jan. 21, 2020 (TW) ................. 109102292

(51) Int. Cl.
| | |
|---|---|
| H01L 23/31 | (2006.01) |
| H01L 23/495 | (2006.01) |
| H01L 23/00 | (2006.01) |
| H01L 21/48 | (2006.01) |
| H01L 21/56 | (2006.01) |
| H01L 21/78 | (2006.01) |

(52) U.S. Cl.
CPC ...... *H01L 21/4842* (2013.01); *H01L 21/4825* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49562* (2013.01); *H01L 23/49582* (2013.01); *H01L 23/562* (2013.01)

(58) Field of Classification Search
None
See application file for complete search history.

(56) References Cited

U.S. PATENT DOCUMENTS

| | | | |
|---|---|---|---|
| 2001/0011598 A1* | 8/2001 | Kobayashi | ........ H01L 23/49562 174/532 |
| 2008/0006937 A1* | 1/2008 | Matsunami | ....... H01L 23/49582 257/734 |
| 2016/0172274 A1* | 6/2016 | Yoon | ................. H01L 23/49541 257/664 |
| 2019/0273035 A1* | 9/2019 | Imori | .................... H01L 21/561 |
| 2020/0075440 A1* | 3/2020 | Majima | ............. H01L 23/49555 |

FOREIGN PATENT DOCUMENTS

| | | |
|---|---|---|
| TW | 200744183 | 12/2007 |
| TW | 201110296 | 3/2011 |
| TW | 201347247 | 11/2013 |
| TW | 201526190 | 7/2015 |

* cited by examiner

*Primary Examiner* — Jay C Chang
(74) *Attorney, Agent, or Firm* — Winston Hsu

(57) ABSTRACT

A semiconductor package structure, including a lead frame, a die disposed on the front side of the lead frame, and a molding piece disposed on the lead frame and encapsulates the die, wherein the lead frame is provided with two extension portions extending respectively from two sides of the molding piece, and the extension portion is provided with recessed front surface and back surface on which a plating layer is formed.

8 Claims, 11 Drawing Sheets

SEMICONDUCTOR PACKAGE STRUCTURE AND FABRICATING METHOD OF THE SAME

BACKGROUND OF THE INVENTION

1. Field of the Invention

The present invention relates generally to a semiconductor package structure, and more specifically, to a semiconductor package structure fabricated by molded array package.

2. Description of the Prior Art

Nowadays, surface mount diodes using surface mount technology are applied in many consumer electronics and automotive electronics, with different sizes and specifications such as SMC, SMB, SMBF, SMA, SMAF or SOD, etc. As the progress of intellectualization and electronization of current vehicles, the electronic devices installed in the vehicles are significantly increased, such as power devices like DC converters, low-power MOS, voltage regulator, voltage suppressor, on-board control unit, or various sensors used in car electric system. All of these electronic devices will use surface mount diodes, so that the demand of surface mount diodes has increased significantly.

Conventional surface mount diodes are usually fabricated by trim form and single die package method, wherein the shear forces during the die cutting process may easily break or cause delamination of molding piece from the lead frame. Furthermore, single die package process would need more clean-up time between each die, and the cost to develop relevant mold components is higher and limited to specific sizes. Therefore, current fabrication process of surface mount diodes has many drawbacks to overcome.

SUMMARY OF THE INVENTION

In light of aforementioned disadvantages in conventional surface mount diode process, the present invention hereby provides a novel semiconductor package structure and method of fabricating the same. With essential features of adopting molded array package and two non-stamping cutting processes, it may efficiently reduce the time required to package, improve the flexibility of molds and provide suitable sizes, and avoiding structural damages of products caused by shear forces in conventional stamping process.

One aspect of the present invention is to provide a semiconductor package structure, including a lead frame with a front surface and a back surface opposite to the front surface, a die disposed on the front surface of the lead frame, and a molding piece disposed on the front surface of the lead frame and encapsulating the die, wherein the lead frame is provided with two extension portions extending respectively from two sides of the molding piece in a first direction, and the extension portion is provided with the front surface and the back surface concaved in a thickness direction of the lead frame, and plating layers are formed on the concaved front surface and the concaved back surface of the extension portion.

Another aspect of the present invention is to provide a method of fabricating semiconductor package structures, including steps of forming a recess on a back surface of a lead frame, performing a die bonding process to bond a die on a front surface of the lead frame, performing a molding process to form a molding compound encapsulating the die on the front surface of the lead frame, performing a half cut process to cut the molding compound and form a cutting surface concaved in a thickness direction of the lead frame on the front surface of the lead frame, wherein the cutting surface and the recess are opposite through the lead frame, performing a plating process to form plating layers on the cutting surface and the recess, and performing a cutting process along the cutting surface to cut the lead frame into multiple individual semiconductor package structures, wherein a width of a blade used in the cutting process is smaller than a width of a blade used in the half cut process, so that each semiconductor package structure is provided with two extension portions extending respectively from two sides of the molding piece in a first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
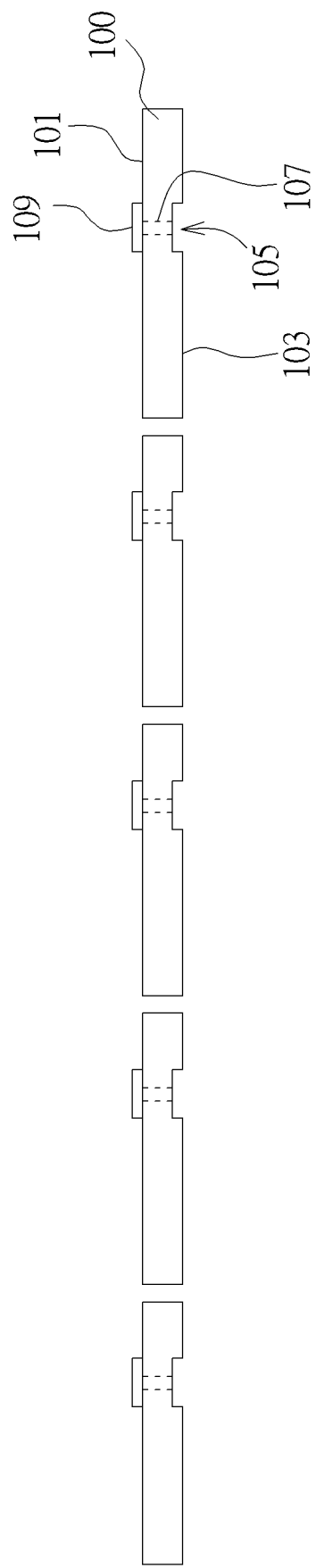
FIGS. 1-7 are schematic cross-sections illustrating the process flow of fabricating a semiconductor package structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

Figure 11:
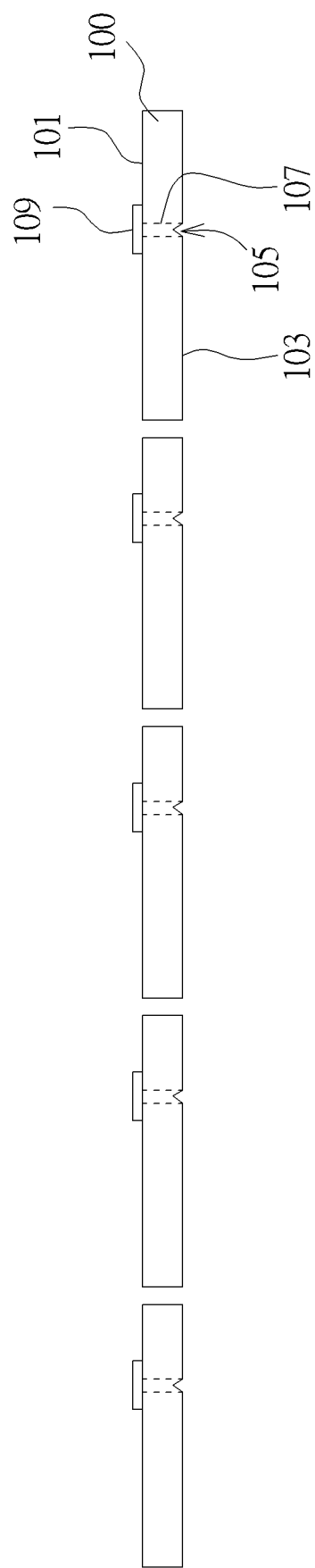
FIG. 11 is a schematic cross-section of a semiconductor package structure in accordance with another embodiment of present invention.

The process flow of manufacturing a semiconductor package structure in accordance with the preferred embodiment of the present invention will be hereinafter described in detail with reference to FIGS. 1-7. First, please refer to FIG. 1. In the beginning of the process, a lead frame 100 with opposite front surface 101 and back surface 103 is provided as a base material. In the cross-section view, the lead frame 100 may be divided into multiple identical or different sections. These sections may be formed in advance by stamping and etching process with sizes depending on the design and specification of final product, such as the specification of surface mount device like SMC, SMB, SMBF, SMA, SMAF or SOD, etc. Please note that although these sections look like they are separated in the cross-section, they are actually connected together in whole lead frame 100. The back surface 103 of each section of the lead frame 100 is provided with a recess 105 formed at a predetermined position to be cut. The recess 105 may be formed by stamping to provide a concaved surface for a plating layer to be formed thereon after cutting. Each section of the lead frame 100 is also provided with a hole 107 extending from the front surface 101 to the back surface of lead frame 100 and overlapping the position of recess 105. The purpose of holes 107 is to provide a lateral recess for solder wicking in final product. Relevant details will be described in following embodiment. In order to avoid molding compounds leaking to the recess 105 on the back surface 105 of lead frame 100 through holes 107, a blocking film 109 may be attached and cover on the hole 107. The material of lead frame 100 may be Cu-based alloys such as oxygen free copper, deoxidized copper or Fe—Ni alloy, etc. In other embodiment, as shown in FIG. 11, the recess 105 may be a V-cut rather than stamping recess.

Figure 2:
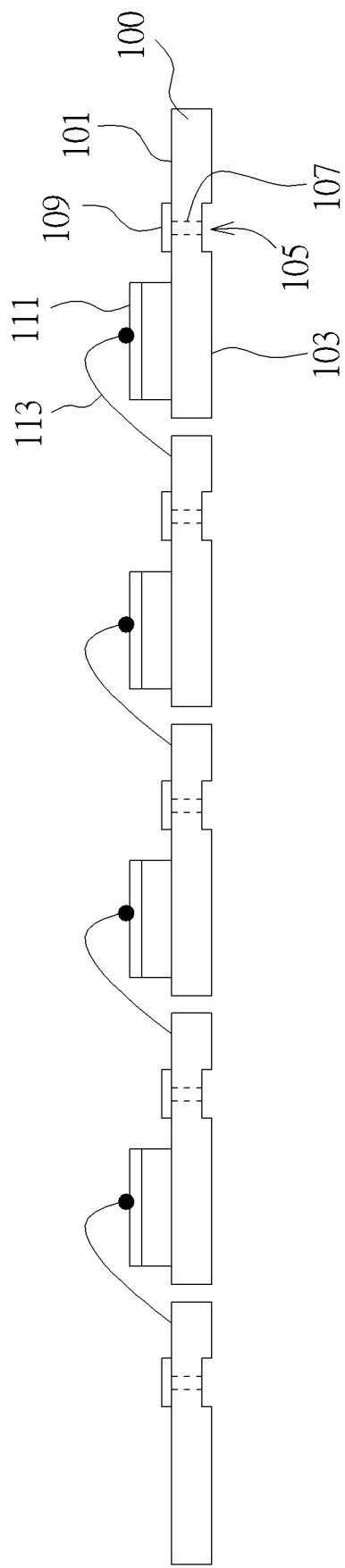

Next, please refer to FIG. 2. A die 111 is disposed on each section of the lead frame 100. The die 111 is bonded on the front surface of lead frame 100 by a common bonding process using glue, heat, pressure or ultrasound, etc., with its position not overlapping the recess 105 on the back surface 103. Subsequently, perform a wire bonding process to electrically connect every die 111 to the lead frame 100 through conductive wires 113. Two ends of the conductive wire 113 are connected respectively to the bonding pad on the die 111 and a predetermined position on another section of the lead frame 100. The predetermined position is preferably between the die 111 and the recess 105 on another section of the lead frame 100. In the embodiment, the die 111 may be but not limited to diode or various electronic devices and the conductive wire 113 may be wire made of Au, Cu, Ag, etc.

Figure 3:
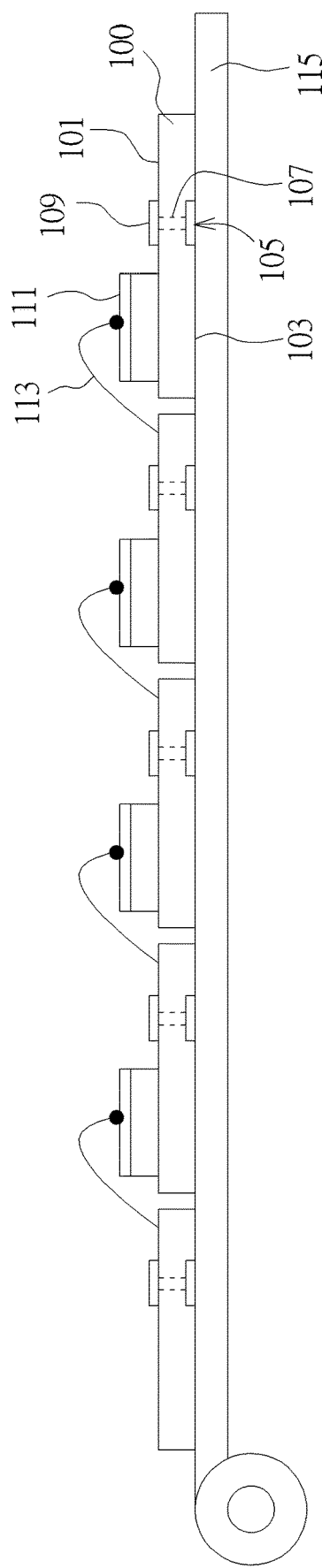

Next, please refer to FIG. 3. After die bonding and wire bonding, attach the back surface 103 of whole lead frame 100 to a tape 115. The tape 115 will seal the back surface of lead frame 100 in later molding process, so as to avoid molding overflow and the formation of defects like burr. The tape 115 may be special heat-resistant tape with high thermal stability for package.

Figure 4:
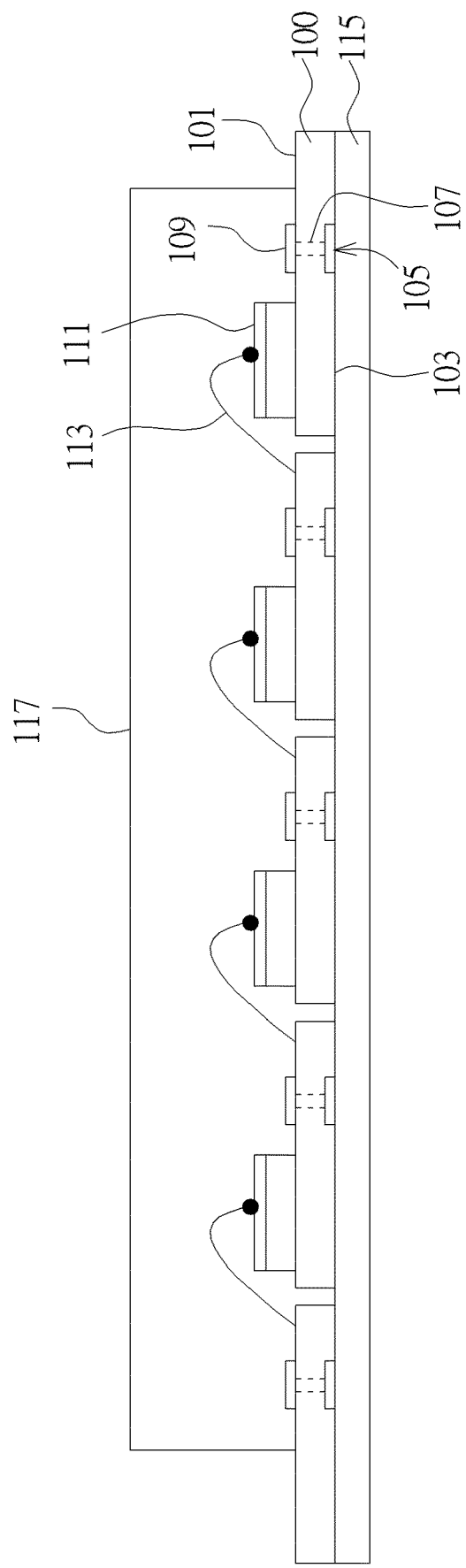

Next, please refer to FIG. 4. After the tape 115 is attached, performing a molding process to form a molding compound 117 on the front surface 101 of the lead frame 100. The steps of molding process may include assembling mold components around the lead frame 100 together with dies 111 and the tape 115, injecting molding compound (ex. epoxy molding compound, EMC), and heating the molding compound to form a large molding piece 117 encapsulating the devices and circuit structure like dies 111 and conductive wires 113 on the lead frame 100. Since these mold components and molding steps are conventional skills and not the essential features of the present invention, relevant detailed descriptions and drawings will be herein omitted. Please note that the molding process adopted in the embodiment of present invention is molded array package (MAP). Unlike conventional single die molding process, the molding piece 117 formed in the MAP process would encapsulate dies 111 on all sections of the lead frame 100. The advantage of this process is that the die may not be molded one-by-one, so as to reduce both the time required to package and lower the cost of mold components. In addition, the mold components may have better flexibility to be used in the fabrication of surface mount diode with various specifications and sizes. In the molding process, since the tape 115 seal the bottom surface of the lead frame and the blocking film 109 covers the holes 107, so that the molding piece 117 would not contact the back surface 103 and the recess 105 of lead frame 100.

Figure 5:
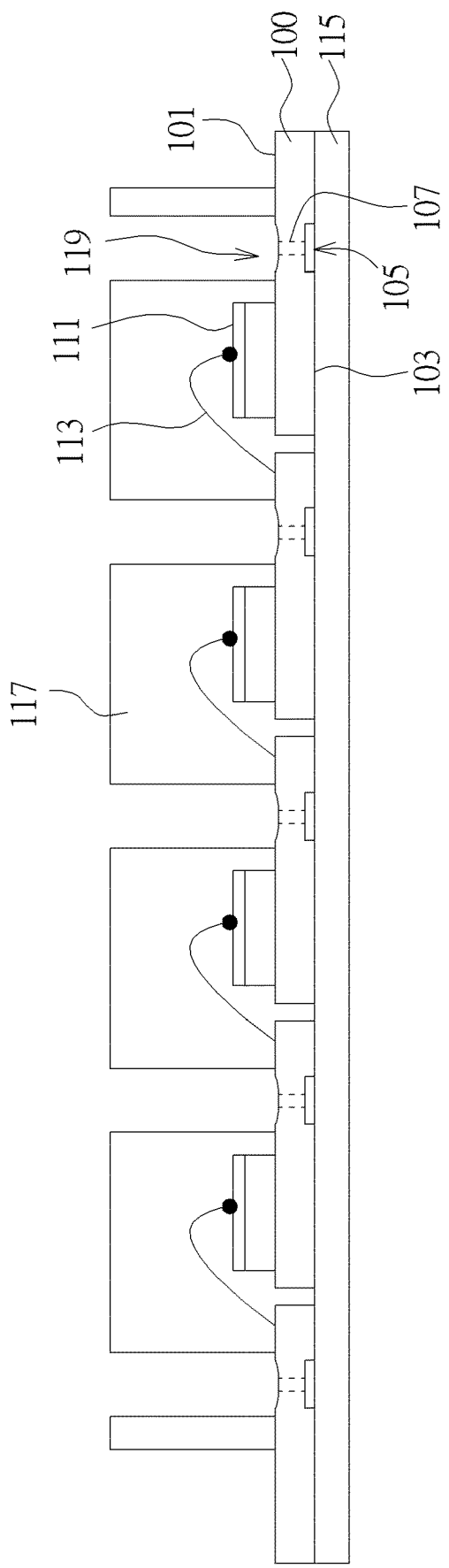

Next, please refer to FIG. 5. After the molding process, performing a half cut process to cut the molding piece 117 into multiple package units with predetermine size. Each package unit includes a die 111 and connecting conductive wires 113 (for the convenience of description, the package unit will still be referred as a molding piece 117). The half cut process may be performed by using cutting machine with circular saw to remove parts of the molding piece 117. In the embodiment of present invention, the removed parts of molding piece 117 corresponds to the position of recess 105 on the back surface 103 of the lead frame 100. In addition to the removed parts of molding piece 117, the blocking film 109 once covering on the hole 107 and a small part of the lead frame 100 are also removed in the half cut process, so as to form a slightly concaved cutting surface 119 and expose the hole 107 in the lead frame 100, as shown in FIG. 5. However, please note that the lead frame 100 in this stage is not separated yet. Furthermore, in the embodiment of present invention, the cutting surface 119 formed in half cut process is slightly concaved in the thickness direction of the lead frame 100. This feature contributes to form a surface suitable for plating and solder wicking in final products.

Figure 6:
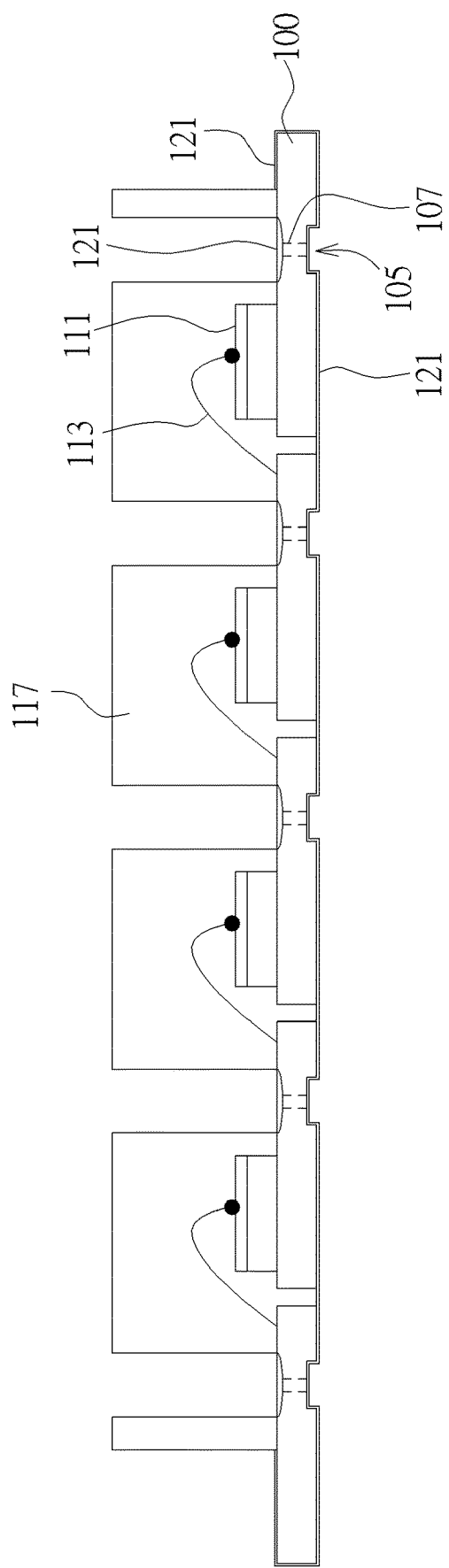

Next, please refer to FIG. 6. After the half cut process, the tape 115 is then removed to expose the back surface 103 of the lead frame 100. This step may include additional cleaning process to clean the residue of tape 115 remaining on the lead frame 100. A plating process, such as common DC plating or AC plating, is then performed to form a plating layer 121 on the surfaces of lead frame 100. In the embodiment, the purpose of the plating layer 121 includes preventing the corrosion caused by temperature variation or environmental change, improving solderability in later surface mounting steps, and making final product more lustrous. The material of the plating layer 121 may be Sn or alloy with metal composition like Sn/Cu/Pb/Pd/Au. Generally, the plating layer 121 will be formed on the exposed surface of metallic lead frame 100. As shown in the figure, the plating layer 121 is formed on the cutting surface on the front surface and the recess on the back surface of the lead frame 100. In addition, the plating layer 121 is also formed on the sidewalls of holes 107. Relevant detailed features will be further described in following embodiments.

Figure 7:
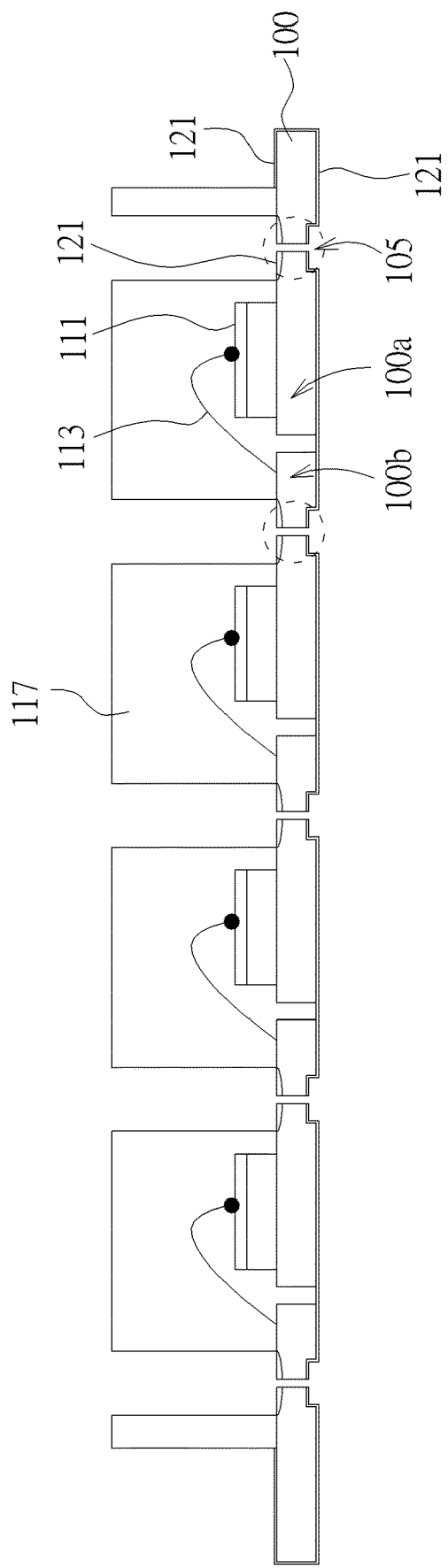

Please refer to FIG. 7. After the plating process, a cutting process is then performed to divide the package structure into individual package units with predetermined size. In the embodiment, the cutting process cuts from the middle of cutting surface with the manner similar to the previous half cut process, i.e. using cutting machine with circular saw to cut off the lead frame 100. However, please note that the width of the blade used in the cutting process is smaller than the width of blade used in previous half cut process, so that each divided semiconductor package structure is provided with two extension portions extending from two sides of the molding piece 117, as indicated by the dashed circle in the figure. In addition, the lead frame 100 of each divided semiconductor structure is provided with a first portion 100a and a second portion 100b, wherein the die 111 is disposed on the first portion 100a of the lead frame 100 and is connected to the second portion 100b of the lead frame 100 through conductive wires 113. The extension portions at two sides will function as leads of package device in later surface mounting process.

In the embodiment of present invention, the advantage of adopting the half cut process as shown in FIG. 5 and the cutting process as shown in FIG. 7 is that the package structure would not be damaged. In conventional surface mount diode process, the package units are usually separated by trim form method, wherein the shear forces during the die cutting may easily break the molding piece 117 or cause delamination of molding piece 117 from the lead frame 100. The approach of present invention is to form recess 105 or notch in advance at predetermined positions on the back surface of the lead frame 100 and then perform half cut process at the predetermined positions on the front surface to remove parts of the molding piece 117 and determine the size of extension portions, and the real cutting process is performed lastly to cut off and divide the lead frame into individual package unit. This approach not only achieves the purpose of forming the extension portions with particular feature and efficacy, but also avoids the structural damage to the final product of the package devices, such as common cracks or delamination issue happening in prior art.

Figure 8:
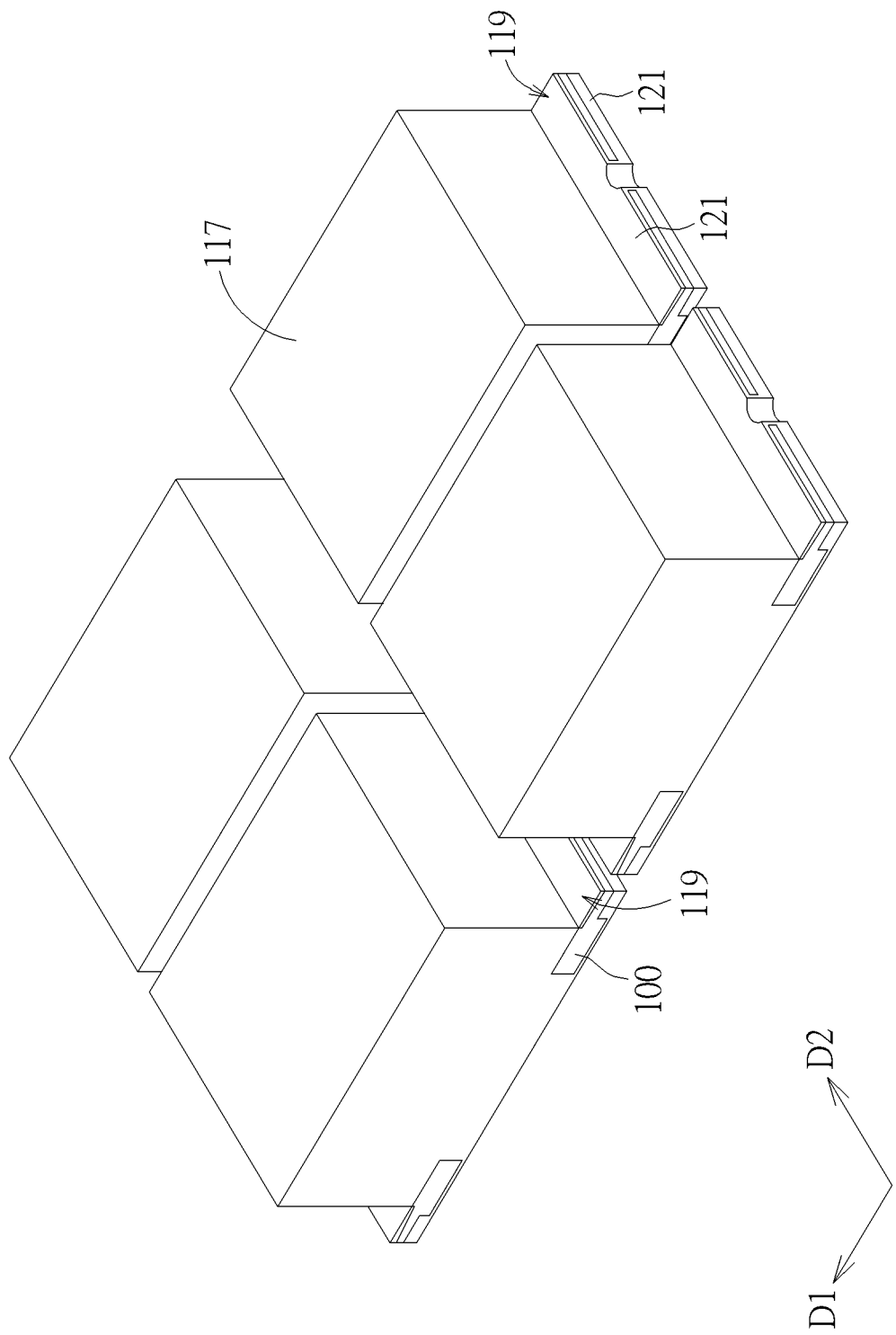
FIG. 8 is a schematic perspective view of a semiconductor package structure in accordance with the preferred embodiment of present invention.

After the description of the process flow of fabricating the semiconductor package device in the present invention, the appearance of semiconductor package device fabricated in the embodiment will now be described. Please refer to FIG. 8, which is a schematic perspective view of a semiconductor package structure in accordance with the preferred embodiment of present invention. It can be seen from the figure that the aforementioned half cut process cuts the molding piece 117 firstly to form a cutting surface 119 extending in a second direction D2 and determine the size of the protruding extension portion to be formed in later steps. The plating layers 121 are then formed on the cutting surface 119 and the back surface of the lead frame 100. Lastly, the cutting process is performed in both the first direction D1 and the second direction D2 to cut off entire lead frame 100 and divide the package structure into individual package units.

Figure 9:
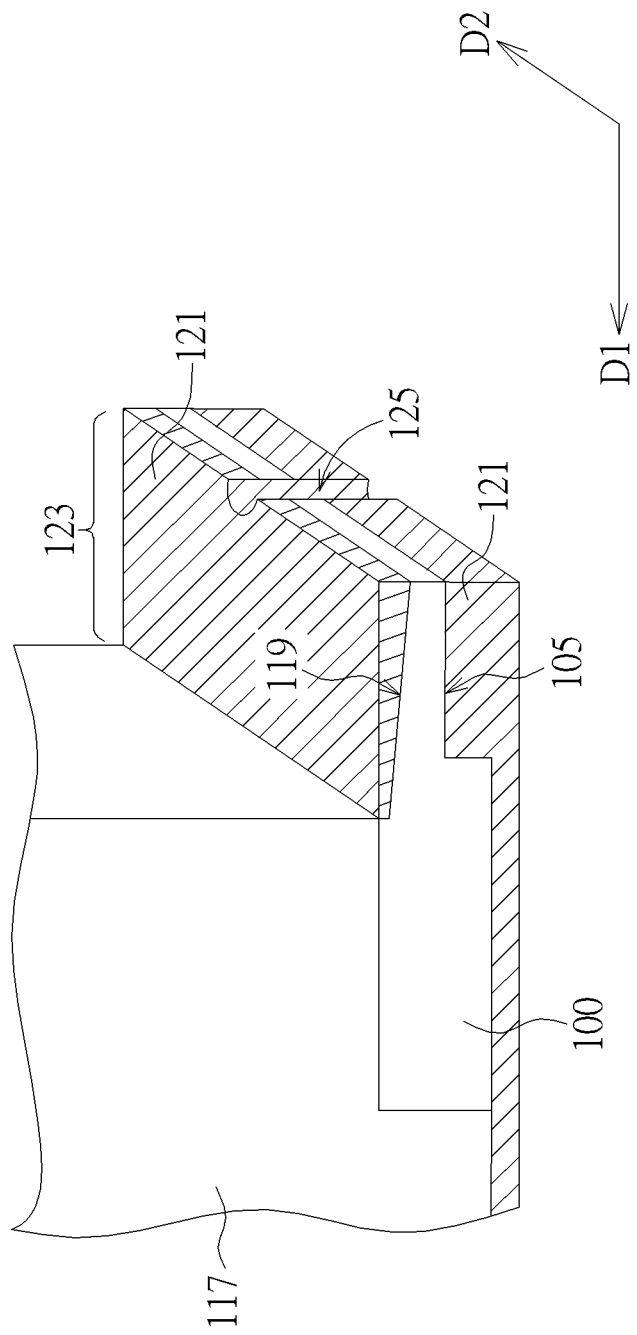
FIG. 9 is a drawing of partial enlargement of extension portions at two sides of the semiconductor package structure in accordance with the preferred embodiment of present invention.

Please refer to FIG. 9, which is a drawing of partial enlargement of extension portions at two sides of the semiconductor package structure in accordance with the preferred embodiment of present invention. According to the aforementioned embodiment, each divided package unit is provided with extension portions 123 protruding in the first direction D1 from the molding piece 117 at two sides of the lead frame 100. The front surface of the extension portion 123 is the cutting surface 119 formed in previous half cut process with slightly concaved feature in the thickness direction. Since the cutting process is performed from the middle of the cutting surface 119, the cutting surface 119 cut in half after the cutting process is provided with a gradually concaved feature toward one end of the extension portion in the first direction D1. This gradually concaved surface feature may cause the plating layer 121 formed thereon to have a flat top surface, rather than forming a plating surface with uneven, bulged appearance and defects. Similarly, the recess 105 formed at the predetermined cutting position on the back surface of the lead frame 100 is also half cut in the cutting process, thereby forming the surface recessed in the thickness direction as shown in the figure. This recess space may also cause the plating layer 121 formed thereon to have a flat top surface rather than forming a plating surface with uneven, bulged appearance and defects. The aforementioned concaved surface on the front surface and the recessed surface on the back surface of the extension portion 123 are opposite to each other through the extension portion 123. It can be seen that no plating layers 121 are formed on the lateral cutting surfaces of the lead frame 100 since they are not exposed yet during the plating process. Furthermore, it can be seen in the embodiment of present invention that the cutting process cut through the hole 107 to form a lateral recess 125 on the lateral cutting surface of the extension portion 123, wherein the lateral recess 125 extends from the plating layer 121 on the front surface of the extension portion 123 to the plating layer 121 on the back surface of the extension portion 123. The purpose of lateral recess 125 is to facilitate the solder wicking in later surface mounting process of the devices.

Figure 10:
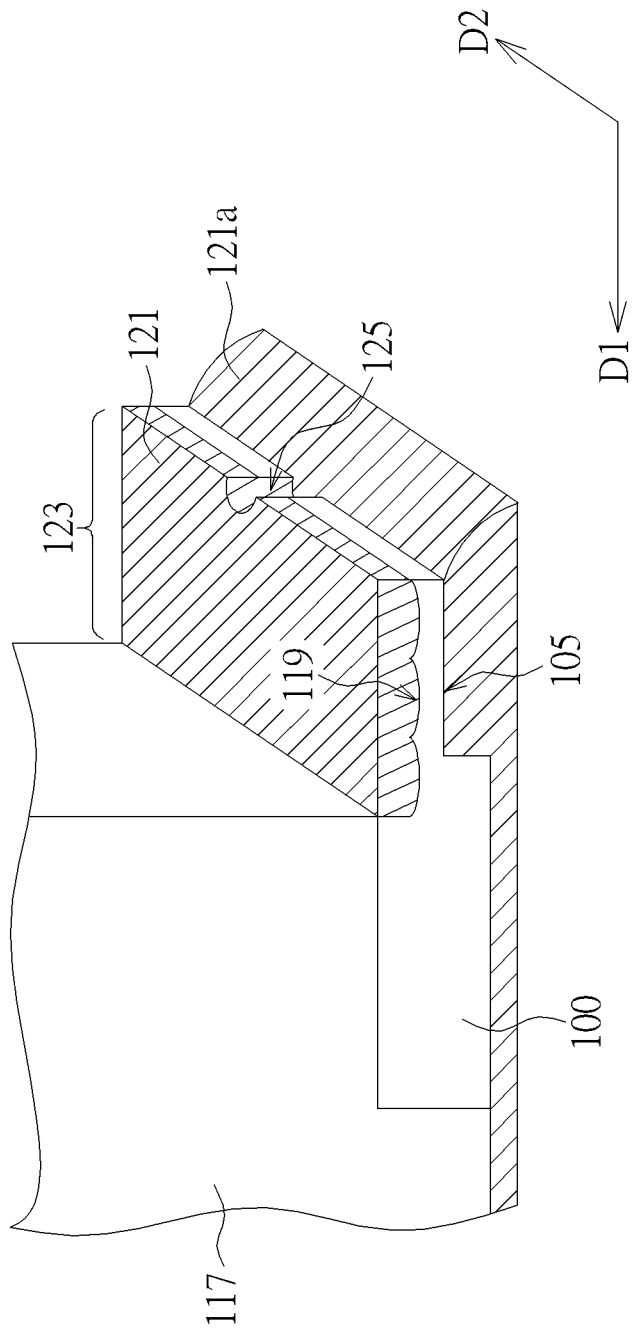
FIG. 10 is a drawing of partial enlargement of extension portions at two sides of the semiconductor package structure in accordance with another embodiment of present invention.

Lastly, please refer to FIG. 10, which is a drawing of partial enlargement of extension portions 123 at two sides of the semiconductor package structure in accordance with another embodiment of present invention. The extension portions 123 of the present invention may have other variant design. As shown in FIG. 10, instead of forming single concaved surface, multiple cutting actions may be performed in the half cut process of the present invention to form multiple continuous concaved surfaces, so that the whole cutting surface 119 is in a wavelike form as shown in the figure. This design may also improve the solderability in soldering. In addition, in this embodiment, the plating layer 121a on the back surface of the lead frame 100 extends beyond the cutting surface in the first direction D1. This design of protruding plating layer 121a may facilitate the inspector to ensure the soldering in later inspection step.

According to the description of aforementioned methodological and structural embodiments, the novel semiconductor package structure and method of fabricating the same disclosed by the present invention may be understood. By adopting molded array package with two-stage non-stamping cutting processes on the particular extension portions, it may efficiently reduce the time required to package, improve the flexibility of mold components and provide suitable sizes, as well as avoiding structural damages to the final products caused by shear forces in conventional stamping process. The solderability and solder wicking of final products are also improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package structure, comprising:
   a lead frame with a front surface and a back surface opposite to said front surface;
   a die disposed on said front surface of said lead frame; and
   a molding piece disposed on said front surface of said lead frame and encapsulating said die;
   wherein said lead frame is provided with exact two extension portions extending respectively from two sides of said molding piece in a first direction, and lateral surfaces of said molding piece, said lead frame and said two extension portions in a second direction are flush, and each of said two extension portions is provided with said front surface and said back surface concaved in a thickness direction of said lead frame, and plating layers are formed on said concaved front surface and said concaved back surface of each of said two extension portions, and said plating layer on said concaved front surface of each of said two extension portions has a flat top surface, and said plating layer on said back surface of each of said two extension portions extends beyond corresponding said extension portion in said first direction, and a lateral recess is formed on a lateral cutting surface in said first direction of each of said two extension portions, and said lateral recess extends from said concaved front surface to said concaved back surface.

2. The semiconductor package structure of claim 1, wherein said plating layer is formed on said lateral recess.

3. The semiconductor package structure of claim 1, wherein said concaved front surface and said concaved back surface of each of said two extension portions are opposite to each other through corresponding said extension portion.

4. The semiconductor package structure of claim 1, wherein said front surface of each of said two extension portions is gradually concaved toward one end of corresponding said extension portion in said first direction.

5. The semiconductor package structure of claim 1, wherein said front surface of said extension portion is wavelike.

6. The semiconductor package structure of claim 1, wherein said lead frame has a first portion and a second portion, and said die is disposed on said first portion and is electrically connected to said second portion through bonding wires.

7. The semiconductor package structure of claim 1, wherein said concave back surface is a stamping recess or a V-cut.

8. The semiconductor package structure of claim 1, wherein said semiconductor package structure is a surface mount diode.

* * * * *